(12) United States Patent
Kang et al.

(10) Patent No.: US 7,266,360 B2
(45) Date of Patent: Sep. 4, 2007

(54) LOW NOISE AMPLIFIER FOR WIRELESS COMMUNICATIONS

(75) Inventors: Dong Kyun Kang, North Potomac, MD (US); Kurt Gordon, Fairfax, VA (US); Jay Wright, Potomac, MD (US)

(73) Assignee: Neoreach, Inc., Bethesda, MD (US)

( * ) Notice: Subject to any disclaimer, the term of this patent is extended or adjusted under 35 U.S.C. 154(b) by 298 days.

(21) Appl. No.: 10/819,395

(22) Filed: Apr. 7, 2004

(65) Prior Publication Data

US 2005/0227652 A1   Oct. 13, 2005

(51) Int. Cl.
*H04B 1/10*   (2006.01)
*H03H 7/32*   (2006.01)

(52) U.S. Cl. ............... 455/302; 455/307; 330/131; 330/302

(58) Field of Classification Search ........... 455/302, 455/285, 290, 307, 333, 341, 343.1, 296; 330/302, 98, 133, 29, 310, 311, 129–131, 330/306, 307
See application file for complete search history.

(56) References Cited

U.S. PATENT DOCUMENTS

| | | | |
|---|---|---|---|
| 5,488,382 A | 1/1996 | Fenzi et al. |
| 5,574,405 A | 11/1996 | Razavi |
| 5,642,080 A | 6/1997 | Whang et al. |
| 5,686,822 A | 11/1997 | Croft et al. |
| 5,697,087 A | 12/1997 | Miya et al. |
| 5,809,410 A | 9/1998 | Stuebing et al. |
| 6,157,822 A | 12/2000 | Bastani et al. |
| 6,175,727 B1 | 1/2001 | Mostov |
| 6,201,426 B1 | 3/2001 | Sumiyoshi et al. |
| 6,288,609 B1 | 9/2001 | Brueske et al. |
| 6,392,490 B1 | 5/2002 | Gramegna et al. |
| 6,407,640 B1 | 6/2002 | Aparin et al. |
| 6,476,676 B1 | 11/2002 | Tanaka et al. |
| 6,542,724 B1 | 4/2003 | Copeland et al. |
| 6,549,766 B2 | 4/2003 | Vorenkamp et al. |
| 6,556,085 B2 | 4/2003 | Kwon et al. |
| 6,590,473 B1 | 7/2003 | Seo et al. |
| 6,628,170 B2 | 9/2003 | Titus |

(Continued)

FOREIGN PATENT DOCUMENTS

KR   1998-023072   7/1998

(Continued)

OTHER PUBLICATIONS

A 2.4 Ghz CMOS Image-REject Low Noise Amplifier, Ming-Hang Sun et al., National Taiwan University.*

(Continued)

*Primary Examiner*—Edward F. Urban
(74) *Attorney, Agent, or Firm*—Seyfarth Shaw LLP

(57) ABSTRACT

A low noise amplifier is provided for the receiver of a wireless communications system. The amplifier incorporates an image rejection function by incorporating a notch filter formed by an inductor and capacitor connected at a node between two active elements of the amplifier. The amplifier also incorporates a gain control function by adding a further active element connected to, on one hand, a node between the inductor and capacitor and, on the other hand, a voltage supply. A gain control signal is connected to the control input of the further active element has an input connected to a feedback lead of the receiver to provide the gain control.

30 Claims, 5 Drawing Sheets

U.S. PATENT DOCUMENTS

| | | |
|---|---|---|
| 6,664,854 B2 | 12/2003 | Tanaka et al. |
| 6,674,337 B2* | 1/2004 | Hashemi et al. ............... 333/32 |
| 6,681,103 B1* | 1/2004 | Rogers et al. .............. 455/302 |
| 6,917,815 B2* | 7/2005 | Hajimiri et al. ......... 455/522.1 |
| 2002/0084855 A1 | 7/2002 | Kwon et al. |
| 2002/0168951 A1 | 11/2002 | Paulus et al. |
| 2003/0052738 A1 | 3/2003 | Tanaka et al. |
| 2004/0219900 A1* | 11/2004 | Zheng et al. ............... 455/302 |
| 2005/0225397 A1* | 10/2005 | Bhatia et al. ............... 330/311 |

FOREIGN PATENT DOCUMENTS

| | | |
|---|---|---|
| KR | 1998-024078 | 7/1998 |
| KR | 1999-003757 | 1/1999 |
| KR | 2001-0068387 | 7/2001 |
| KR | 2001-0101903 | 11/2001 |
| KR | 2002-0018736 | 3/2002 |

OTHER PUBLICATIONS

Design of a 950 Mhz CMOS Inegrated Image REject Front-End Receiver; A.A. Moneim et al., Ain Shams University, Egypt.*

Simulation of a 915 MHz Receiver Using the HP Advanced Design System™, E. Benabe, A, Kuppusamy, T. Weller, , P. Flikkema and L. Bunleavy, 52nd Automatic Radio Frequency Techniques Group (ARFTG) Conference 1998 (1 page).

A 2.4 Ghz CMOS Image-Reject Low Noise Amplifier, Ming-Chang Sun, Shing Tecqchen, Ying-Haw Shu, Wu-Shiun Feng, National Taiwan University (4 pages).

Design of a 950-MHZ CMOS Integrated Image Reject Front-End Receiver; A.A. Moneim, K. Sharaf, H.F. Ragaie, M. Marzouk Ibrahim, Ain Shams University, Egypt (4 pages).

Heterodyne Receivers, http://www.ee.byu.edu/ee/class/ee444/ComBook/Com Book/node 77.html (3 pages).

A 1.25V Direct-Conversion CMOS Transmitter Front-End for 900 MHz Zigbee Applications, Moon-Su Yang, Seung-Min Oh, Trung-Kien Nguyen, and Sang-Gug Lee, Information and Communicaitons University, Korea (5 pages).

CMOS RFIC Architechtures for IEEE 802.15.4 Networks, John Notor, Anthony Caviglia, Gary Levy, Cadence Design Systems, Inc., Maryland (4 pages).

McGill University, Department of Electrical and Computer Engineering, Communications Systems 304-411A, The Super-heterodyne Receiver (pp. 1-6).

Transceiver architectures for wireless Ics by Jesal L. Mehta, Feb. 2001, www.rfdesign.com (only have even Pages).

A Differential 2.4 GHz Switched-Gain CMOS LNA for 802.11b and Bluetooth, Robert Point, Michael Menders and William Foley, Global Communications Devices, MA, 2002 IEEE (pp. 221-224).

* cited by examiner

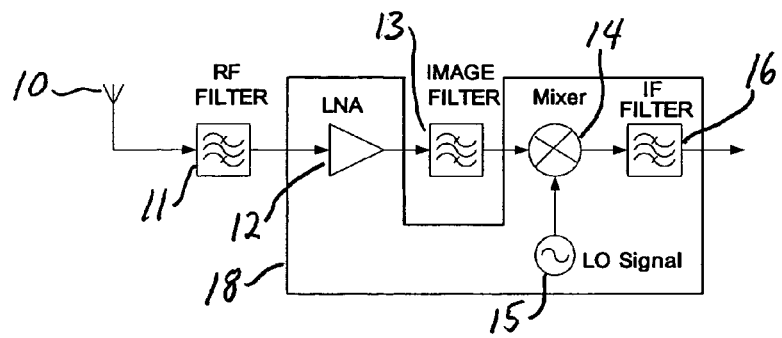
FIG.1 The receiver system with external filter for image rejection in super heterodyne
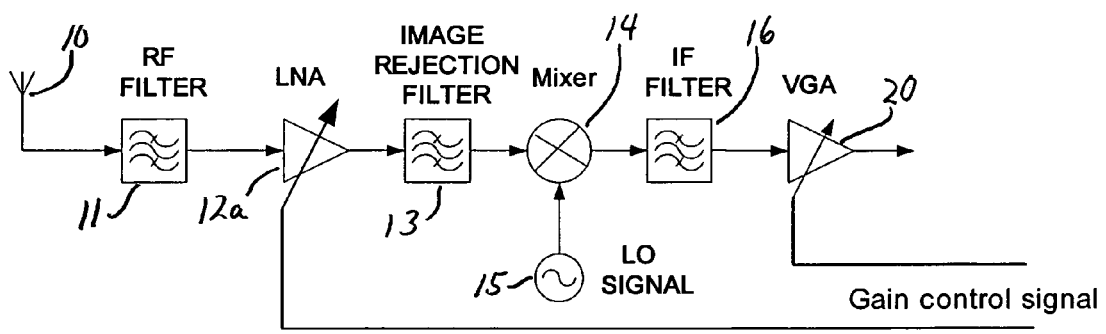
FIG. 2 The receiver system with the Voltage gain control

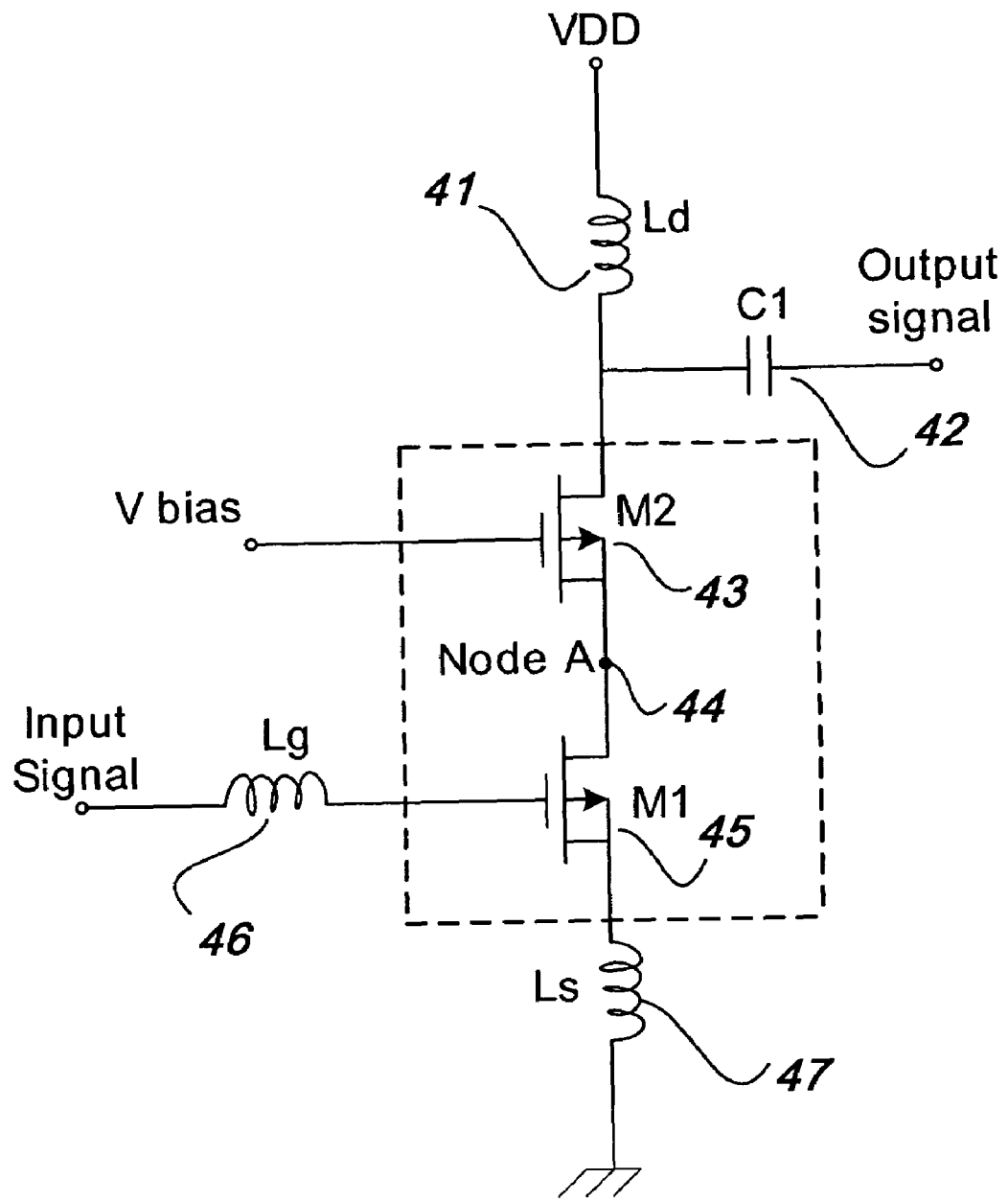
FIG.3 Conventional Cascode Amplifier

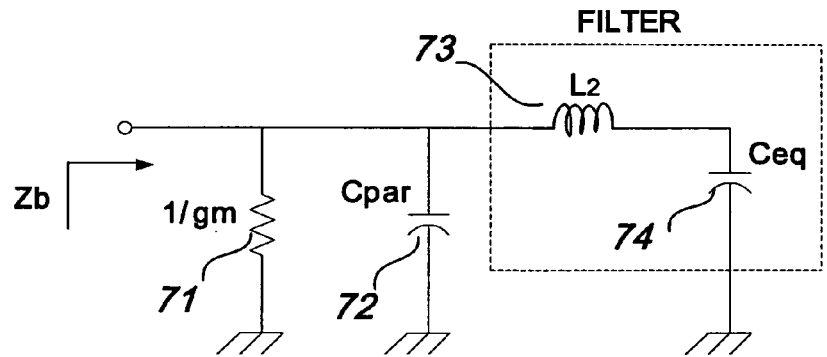
FIG. 5 The equivalent circuit of impedance Zb at node B of FIG.4
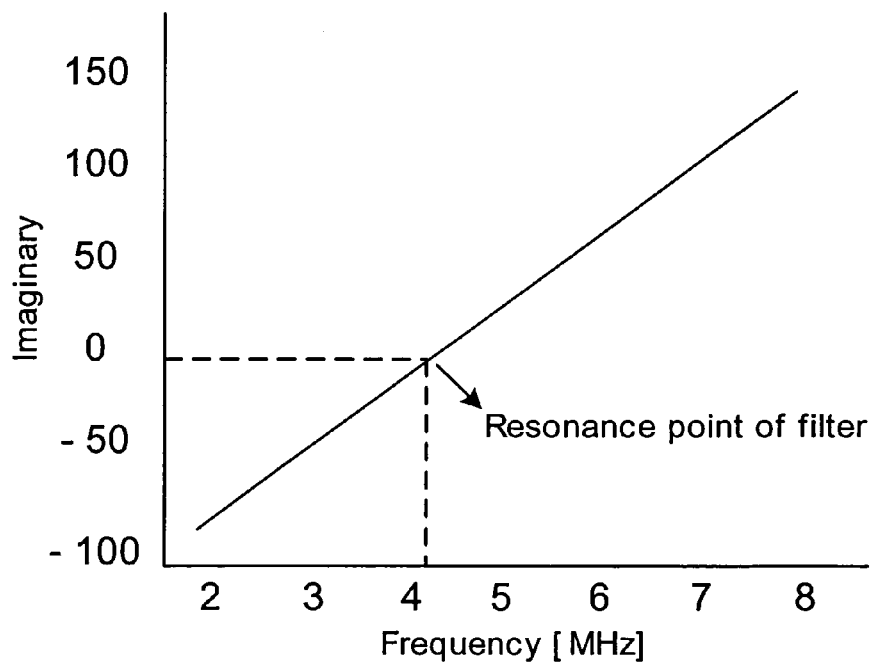
FIG.6 The Imaginary part of impedance of only filter

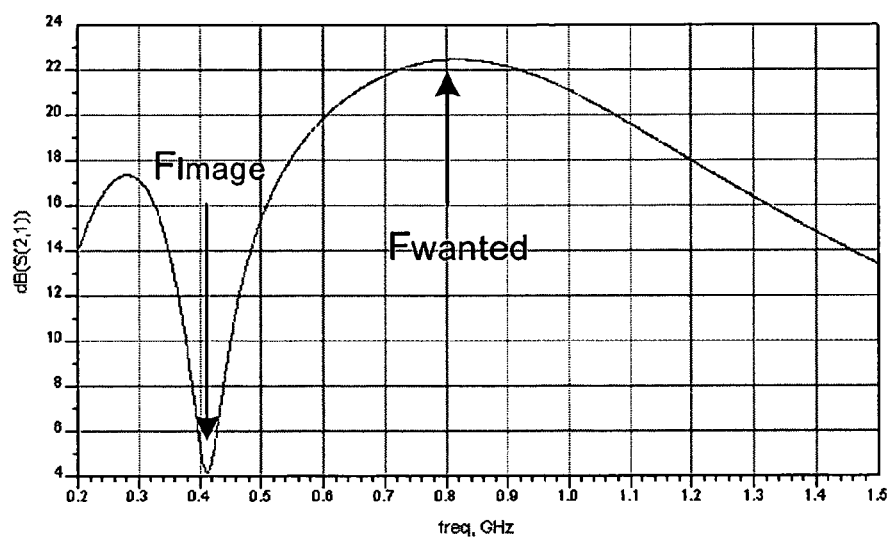
FIG. 7 The log scale of impedance Zb at node B.

LOW NOISE AMPLIFIER FOR WIRELESS COMMUNICATIONS

BACKGROUND OF THE INVENTION

1. Field of the Invention

The present invention relates generally to an amplifier for use in a wireless communication system, and in particular to a low noise amplifier for use in a radio frequency receiver.

2. Description of the Related Art

With the explosive growth in the commercial wireless telecommunications market, a greater need is seen for lower cost and more highly integrated telecommunications equipment. Integrated semiconductor devices provide the possibility of meeting both needs. For example, silicon based devices may provide the necessary characteristics to address a wide range of applications. CMOS (Complementary Metal Oxide Semiconductor) technology is becoming feasible for high frequency analog applications that were traditionally built with more expensive technologies such as bipolar devices. Sub-micrometer CMOS technologies now exhibit sufficient performance for RF (Radio Frequency) applications in a few gigahertz ranges. However, using a standard CMOS technology, the design of amplifiers for use at high frequencies requires more detailed considerations than those for use at low frequencies.

In FIG. 1 is shown a super-heterodyne architecture of the type that is widely used in modem wireless communications handsets. The receiver includes an antenna 10 having an output connected to a radio frequency (RF) filter 11. The filter output is connected to a low noise amplifier 12 that in turn is connected to an image filter 13. The image filter 13 output is fed to a mixer 14 which has a second input connected to a local oscillator (LO) signal 15. The output of the mixer 14 is provided to an intermediate frequency (IF) filter 16. The output of the IF filter is used in the communications system in a way that is well known.

This architecture is capable of providing high reliability and stable performance in mobile communications. In super-heterodyne receivers, the image frequency presents a problem because the image frequency is superimposed on the desired signal. In order to solve this problem and provide removal, or rejection, of the image frequency signal, the super-heterodyne receiver front-end can consist of any of several topologies. Especially useful approaches are the use of an image rejection filter component in a Hartley architecture or a Weaver architecture.

Modem radio frequency receivers are often provided on a semiconductor chip to provide the advantages of lower cost, greater compactness and reduced power consumption. The chip is indicated in FIG. 1 by the solid line 18 enclosing the low noise amplifier 12, local oscillator 15, mixer 14 and IF filter 16. Currently, most of the commercially available radio frequency receivers use off-chip passive bandpass filters, such as ceramic or surface acoustic wave (SAW) filters, because the off-chip filters provide the most robust solution to the image rejection problem. As has been well known for years, surface acoustic wave bandpass filters have a number of advantages, for example, no power consumption, no linearity degradation, and extraordinarily high quality factor. However, the high cost and large size of such separate bandpass filters make these filters less attractive for use in the next generation receivers. The conventional receiver system of FIG. 1 uses an external filter for image rejection. Specifically, the RF filter 11 and image filter 13 are provided as external components to the chip 18.

The current, off-chip passive filters, such as surface acoustic wave filters or ceramic filters, are used for image frequency rejection, but these bulky filters are the major impediment to raising the level of integration of the radio frequency circuit since they cannot be easily integrated. Systems using these filters have a relatively high cost and large size. Therefore, to decrease the circuit size, monolithic integration of the filter with the other electrical devices of the receiver circuit is being researched.

In applications for use at frequencies below 3 GHz, monolithic circuits are provided using an image rejection mixer for phase cancellation to satisfy an image rejection specification of better than 41 dB. Practical systems require higher values of image rejection. As such, it would be desirable to combine an on-chip image filter with an integrated image reject mixer to obtain a very high on-chip image rejection.

When a wide range of signal powers is received by an antenna in a wireless communications system, the system requires the addition of a variable gain stage. The variable gain function is generally provided in later stages in the radio receiver system. For example, in FIG. 2 is provided a variable gain amplifier 17 at the output of the IF filter 16. The variable gain amplifier includes a control lead 18, as is well known, for controlling the output gain of the variable gain stage to compensate for changes in the power of the received signal.

If the variable gain function is provided at the early stages in the system such as using a low noise amplifier (LNA) 12 a such as shown in FIG. 2, then the gain variation is being made in the presence of minimum power signals and the signal-to-noise ratio increases. If instead the gain control is provided later in the receiver system while in the presence of maximum power signals, the last stage of the receiver is not saturated. Furthermore, with such gain controllable low noise amplifiers (LNA), the target dynamic range of the VGA (Variable Gain Amplifier) 20 tends to be degraded.

A low noise amplifier (LNA) is used in the RF receiver in a wireless communication application to obtain the necessary power gain and decreasing the noise factor (NF). Conventional low noise amplifiers have high power consumption at radio frequencies to satisfy the required power gain and to provide the characteristics necessary in an RF receiver application. The conventional LNA uses a one unit common source amplifier structure as shown in FIG. 3 configured as a cascode amplifier.

In particular, the amplifier circuit of FIG. 3 includes a first FET 45 connected with a gate inductor 46 at its gate lead, through which is fed the input signal of the amplifier circuit. The source of the FET 45 is connected through a source inductor 47 to ground. The drain of the FET 45 is connected to a source of a second FET 43 at a node 44. The drain of the second FET 43 is connected through a drain inductor 41 to the supply voltage VDD. A bias voltage $V_{bias}$ is connected at the gate of the second FET 43. A capacitor 42 is connected to the drain of the second FET 43 as well to provide the output signal for the amplifier through the capacitor.

Operationally, in FIG. 3 in order to achieve low noise and to provide power matching at the same time, the source inductor 47, also denoted Ls in the drawing, is used. When an inductor having a high quality factor is used for this source degeneration function, the result is that the amplifier has good noise performance. The bonding wire to the chip has been used as the inductor for source degeneration, and its length is selected by considering a minimum size at for the chip layout and for bonding. The drain inductor 41, also denoted Ld, the source inductor 47 and the gate inductor 46, also denoted Lg in the drawing, as well as the capacitor 42, also denoted C1, are external elements. The gate inductor 46 and the source inductor 47 are used for matching input impedance, and the drain inductor 41 and capacitor 42 are used for matching output impedance. The bias signal $V_{bias}$ is supplied to the gate of the transistor 43, also denoted M2 on the drawing. The elements within the dashed line are on the chip. In this structure, the signal is amplified by the gain of the cascode structure of the two transistors 45 and 43.

Amplifiers of this type are used in wireless communications. Wireless communications systems have exhibited remarkable growth over the past decade. Wireless voice and data applications are being enabled by rapidly emerging wireless technologies, such as cellular telephony, personal communications systems and wireless local area network (WLANs), to name a few. Digital modulation techniques, miniaturization of transceivers due to advances in monolithic integrated circuit design and the development of high frequency, microwave and millimeter wave RF systems in both the licensed and unlicensed bands have all contributed to improving the quality and bandwidth capacity of these systems and to reducing the size and costs of the components.

The LNA (Low Noise Amplifier) is a critical front end component of a wireless receiver. As noted above, its function is to take the relatively weak signal received at the antenna and, after filtering of the signal, amplify it with maximum power transfer and with a minimum of added noise for further processing (referred to as down conversion, etc.). The maximum power transfer is achieved by designing the LNA to have an input impedance that matches a characteristic input impedance of the antenna, which is commonly 50 ohms. Thus, a true concurrent LNA, as a critical front end component of a concurrent receiver, must be capable of (1) matching the characteristic input impedance of the received signal at the antenna at the respective frequency band; (2) simultaneously amplifying the received signal(s); and (3) accomplishing the above with minimum added electrical noise.

SUMMARY OF THE INVENTION

The present invention provides a LNA (Low Noise Amplifier) for use at radio frequencies in a wireless communication system, the amplifier preferably being used in an early stage of the wireless receiver and having a low noise characteristic. In one embodiment, the amplifier has a cascode configuration and includes an added inductor at a node between the two active elements to cancel parasitic capacitance and thereby cancel high frequency leakage.

Further embodiments utilize the added inductor as part of a filter section to provide filtering of the image frequency from the radio signal. The previously mentioned inductor functions in combination with an added capacitor to provide this image rejection.

In yet further embodiments, the present low noise amplifier includes an added gain controller to simultaneously provide, in a preferred embodiment, image rejection and gain control functions in a low noise amplifier. The gain controller is provided by an active element, such as a FET (Field Effect Transistor) at the gate of which is connected a control signal. An added benefit of the preferred embodiment is that noise contributions are reduced compared to the core LNA cascode amplifier device. In addition, the gain control improves the input linearity of front-end circuit in the presence of large signals.

The present low noise amplifier is used for wireless communications systems, including wireless communications at 915 MHz according to the Zigbee (section 802.15.4) standard as well as for wireless communications systems using Wi-Fi or Bluetooth (section 802.11a, b and g) standards, GSM systems, CDMA, TDMA, packet data systems, etc.

BRIEF DESCRIPTION OF THE DRAWINGS

The features of the present invention will become more apparent from the description given in further detail hereinbelow with reference to the accompanying drawings.

FIG. 1 is functional block diagram of a super-heterodyne receiver circuit having with an external filter for image rejection, according to the prior art;

FIG. 2 is a functional block diagram of a receiver system showing voltage gain control both early in the system and later;

FIG. 3 is a circuit diagram of a conventional cascode amplifier;

FIG. 5 is a circuit diagram of an equivalent circuit of impedance Zb at node B of FIG. 4;

FIG. 6 is a graph of an imaginary part of impedance of only a filter portion of the present circuit; and FIG. 7 is a logarithmic scale of impedance Zb at node B of FIG. 4.

DETAILED DESCRIPTION OF THE PREFERRED EMBODIMENTS

Figure 4:
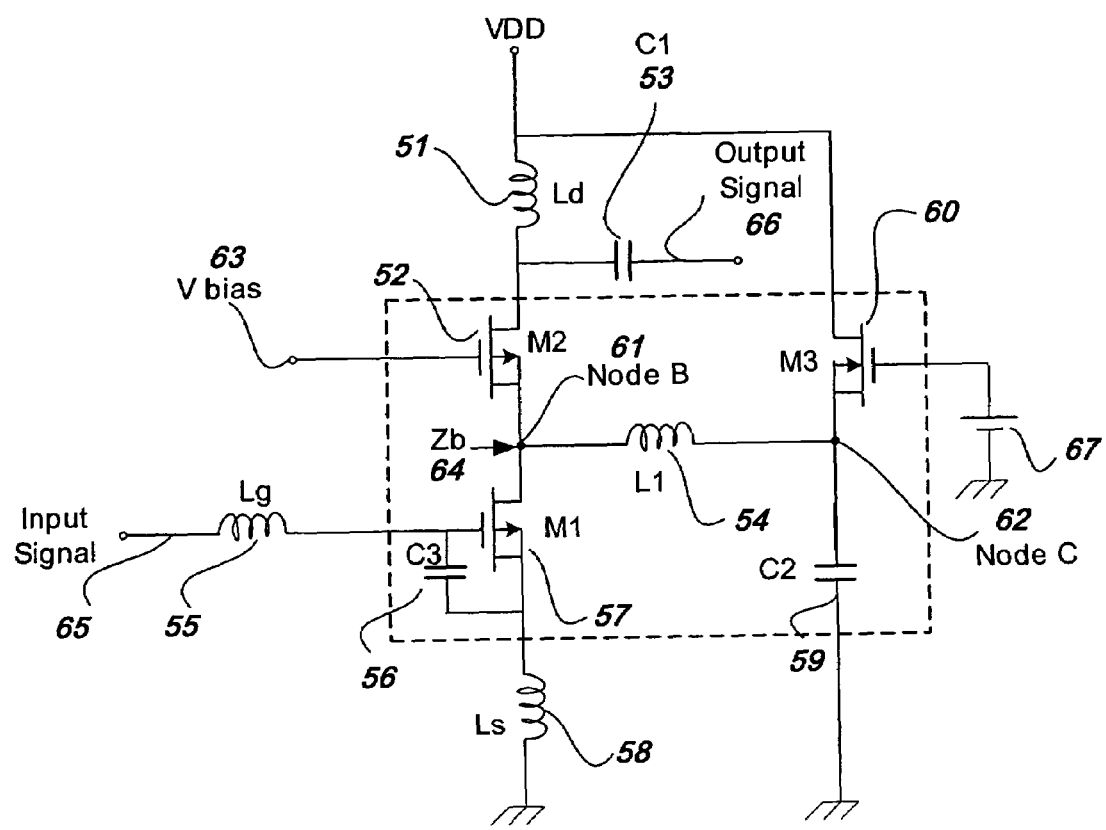
FIG. 4 is circuit diagram of a low noise amplifier according to the principles of the present invention.

The present invention provides an improvement over the conventional cascode amplifier that is used in a radio frequency receiver communication system. The present low noise amplifier eliminates the need for an external image rejection filter from the receiver circuit so that there is no longer a requirement for an off-chip filter for image rejection. This enables a higher level of integration, a more compact circuit and lower costs.

The circuit of one embodiment of the present low noise amplifier is shown in FIG. 4. The amplifier, like the amplifier of FIG. 3, has two FETs (Field Effect Transistors) connected to one another. Here, FETs 52 and 57 are provided. The present invention recognizes that the low noise amplifier of FIG. 3 generates a signal leakage due to the parasitic capacitance of node 44, also denoted node A in the figure. In order to solve this signal leakage problem, the first improvement of the LNA topology provides a resonance inductor connected at node A to cancel the parasitic capacitor. The added inductor is indicated by reference character 54 in FIG. 4, and also denoted L1 in the figure.

A further improvement is added in the circuit of FIG. 4; specifically, the capacitor 59, also denoted C2, is added between the opposite end of the inductor 54 and ground to provide filtering. By choosing the relative values of the inductor 54 and capacitor 59, a notch filter is provided to remove the image frequency signal which plagues super-heterodyne receivers.

In yet a further improvement realized in the present invention, the amplifier circuit has an added FET 60 connected with its source and drain path connected at one end between the supply voltage and the drain of the transistor 52 and at the other end to the capacitor 59. In the illustrated embodiment, the connection of the transistor 60 is between the drain inductor 51 and the voltage supply. This has the effect of shutting off the transistors 52 and 57 as the transistor 60 is switched on, thereby providing the gain control using the low noise amplifier circuit.

A control is connected to the gate of the FET 60 to vary the current flow through the FET 60. In the preferred embodiment, the control is a voltage control 67. The voltage control 67 is derived from the same source as the variable control signal used to provide gain control in the known variable gain receiver circuit. As such, the control voltage is well known in the art and need not be addressed further here.

In the circuit of FIG. 4, the inductors 55, 58 and 51 and the capacitor 53 are external elements, while the remaining elements are integrated on a chip. Specifically, in the preferred embodiment, the inductors 55, 58 and 51 and the capacitor 53 are provided within the housing of the semiconductor chip, although not on the chip itself. These elements are provided by the lead wires connecting the semiconductor chip body to connector pads within the chip housing.

The inductors 55 and 58 are used for matching input impedance, and inductor 51 and capacitor 53 are used for matching output impedance. An additional capacitor 56 is provided at the gate-source connection of the first transistor to provide input matching stability.

In this structure, the input signal is represented as a series connected inductor 55 and the output signal is represented as a series connected capacitor 53. The transistors 57 and 52 provide the amplification function and are connected in a cascode amplifier configuration. The transistor 60 is used as the gain control amplifier.

The input signal on the line 65 is input to the cascode amplifier. The value of the inductor 55 is selected to assist the amplifying transistor 57 in achieving improved gain and a better noise figure. The drain of the transistor 52 is connected to the voltage signal Vdd through the inductor 51 and the drain of the transistor 60 is also connected to the voltage signal Vdd. The entire gain is obtained by multiplying of the gain of cascode amplifier and common source amplifier.

The input signal is amplified according to the gain of the cascode structure composed of the transistor 52 through coupling to the gate of the common source transistor 57 by capacitor 56. The drain of the common source transistor 52 is connected to the output. The inductance 54 connected between a drain of the transistor 57 and the source of the transistor 60. The capacitance 59 is connected to the source of the transistor 60. The inductance 54 and capacitance 59 operate as a notch filter. A proper selection of the inductor 54 and the capacitor 59 can reduce the signal leakage and provides a substantial reduction in the amplitude of the signal at the image frequency that can be occurred at the node B 61. This technique of forming a notch filter for removing the image frequency also provides an improved noise figure performance for the LNA.

The inductor 54 is an on-chip spiral inductor. In order to obtain much higher quality factor, the spiral inductor is designed with a thick top metal layer. The capacitor 59 is also integrated into the chip, using for example MIM (metal-insulator-metal) capacitor methods. Integration of these elements in the chip lowers costs of the circuit, reduces the size of the circuit by a considerable amount, and provides a high efficiency and low noise circuit.

In addition to the image rejection function, in order to provide gain control to the LNA, this invention proposes a new LNA topology, which allows DC bleeding current in the circuit as shown in FIG. 4.

In FIG. 4, the impedance Zb 64 which is the impedance looking to the node B 61 can be presented as an equivalent circuit as shown in FIG. 5. As can be seen in the equivalent circuit, the capacitor Cpar 72 is the overall parasitic capacitance at node B 61, the capacitor Ceq 74 is the sum between the capacitor 59 and the overall parasitic capacitor at node C 62 in FIG. 4. The resistance 1/gm 71 is the transconductance of the transistor 52.

In order to characterize effect of the filter in FIG. 4, the impedance Zb is determined by:

$$Zb(S) = \frac{S^2 L_2 Ceq + 1}{S(S^2 CparL_2 Ceq + Cpar + Ceq)} \qquad \text{eq. (1)}$$

From the equation eq(1), it can be seen that the filter has imaginary zeros and poles at $$f_{image} = \frac{1}{2\pi\sqrt{L_2 Ceq}} \qquad \text{eq. (2)}$$

And $$f_{wanted} = \frac{1}{2\pi}\sqrt{\frac{1}{L_2}\left(\frac{1}{Cpar} + \frac{1}{Ceq}\right)} \qquad \text{eq. (3)}$$

Where $f_{image}$ and $f_{wanted}$ are frequencies of the wanted, or desired, image signal and interest signal respectively.

From equations eq(2) and eq(3), in order to increase the image rejection effect, the inductor 73 and the capacitors $C_{par}$ and $C_{eq}$ should have high quality factors.

Operationally, the present low noise amplifier operates by direct conversion rather than as a super-heterodyne receiver.

In one example of the circuit for use at 915 MHz according to the Zigbee standard, the elements have approximately the following values: the inductor 55 is 34 nH, the capacitor 56 is 1 pF, the inductor 58 is 430 pH, the inductor 51 is 9 nH, the capacitor 53 is 0.7 pF, the inductor 54 is 1 nH, the capacitor 59 is 1 pF, the range of the control voltage output by the gain control element 67 is in a range of 0 to 1 volt, the field effect transistors 52 and 57 are NMOS transistors, and the field effect transitor 60 is a PMOS transistor.

FIG. 5 shows the imaginary part of impedance of only filter. At low frequencies, the filter has capacitor characteristic but inductor characteristic at high frequency. The resonance point of filter of FIG. 6 indicates the frequency of the image rejection designed from equation eq(2).

In FIG. 6, the log scale of the impedance Zb at node B of FIG. 4 is shown as an intersection of frequency and an imaginary impedance. The intersection is indicated as a line and a point on the line at the frequency in question indicates a resonance point of the filter.

As can be seen from FIG. 7, the response curve of the amplifier in the area of the wanted frequency is generally flat while the response curve at the image frequency has sharp decrease in the response. The image frequency is removed from the output signal so that an image rejection filter is not needed later in the receiver circuit. The reason for the response is reversed of the transconductance gm2 of FIG. 7. The filters operated as a series resonance circuit, is not independent on the reverse of the transconductance gm2. But the parallel resonance circuit at the wanted frequencies depends on the reverse of the transconductance gm2.

The current determined by the transconductance stage flows into the transistor 52 and 60. The transistors 52 and 60 are switched by the gate bias of the transistor 60 and one of the transistors is turned on. If the transistor 52 turns on, the current switch gain control amplifier acts as an usual cascade amplifier and has a high gain, while if the transistor 60 turns on most RF power is thrown away into Vdd through the transistor 60 and it leaks only the little power set by the isolation characteristic of the transistor 52 to the output. In order to reduce the noise contribution, the small width of transistor 60 bleeding current should be selected.

In equation eq(2), the image frequency is related to intermediate frequency in subsequent mixer. Since the filtering at image frequency means the leakage, the noise performance is bad at this frequency. Therefore, the tail of filtering can increase e the noise figure at the wanted frequency. The half of the tail width of filtering must be larger than the intermediate frequency of the mixer.

Thus, the present low noise filter eliminates the need for a separate gain control in the receiver circuit and also eliminates the need for a separate notch filter in the receiver circuit. All this is possible while increasing the level of integration of the low noise amplifier. The present invention provides not just an add-on to an existing amplifier structure, but a combination of elements assembled in such a way as to achieve a new result.

The present amplifier is used, for example, for a 915 MHz receiver system of a wireless communication in CMOS technology. The present amplifier may, however, be used in wireless communications systems operating at frequencies of from 400 MHz up to as much as 5900 MHz.

In order to improve the image rejection characteristics of the amplifier, the amplifier uses a notch filter composed of a spiral inductor and capacitor. The elements of the filter should have a high quality factor in order to make sharp bandwidth notch. So, using the spiral inductor with higher quality factor instead of another type of inductor and using a MIM (metal-insulator-metal) capacitor that are fabricated together, the notch filter with a narrow bandwidth is achieved. Furthermore, since attaching the filter at the midpoint of the cascode topology connected transistors reduces leakage due to parasitic capacitance, the noise figure at interest frequency can be enhanced. In addition to gain control function, the input linearity of system is enhanced. Since a low noise amplifier with only an amplification function located at a stage is going before the mixer in the receiver system, a large signal to input of the receiver can be saturated at following stage.

The low noise amplifier of the preferred embodiment is characterized wherein in order to provide image rejection for a 915 MHz receiver system, it uses a spiral inductor 54 and MIM capacitor 59 as a notch filter. The inductance of the notch filter added to LNA cancels the parasitic capacitance generated between common source and common gate transistor. Therefore, the leakage due to the parasitic capacitance can be reduced and the noise performance of the LNA is improved.

The preferred low noise amplifier is further characterized wherein order to provide gain control, the transistors 52 and 60 are switched by the gate bias of a transistor 60 and one of the transistor is turned on. The current switch gain control amplifier acts as an usual cascade amplifier and has a high gain, while if the transistor 60 turn on most RF power is thrown away into the supply voltage Vdd through the transistor 60.

Thus, the present low noise amplifier of the preferred embodiment provides the advantages of eliminating the need for an off-chip image rejection filter and eliminating the need for a separate gain control. The amplifier provides an improved noise performance. The amplifier is preferably integrated on the semiconductor chip using CMOS technology.

A particular application for the present low noise amplifier is in the early stages of a receiver circuit for the 915 MHz wireless communications according to the section 802.15.4 standard (referred to as Zigbee). Application in other wireless communications systems is of course possible. For example, the Bluetooth and Wi-Fi communications systems according to sections 802.11a, b or g would benefit from the present low noise amplifier. Wireless Local Area Networks (WLANs) or various packet data transmission systems, GSM communications, so-called 3G systems, etc. may also use the principles in the present invention. Of course, other applications both within wireless communications and outside the wireless communications field are possible and are encompassed within the present invention.

Although other modifications and changes may be suggested by those skilled in the art, it is the intention of the inventors to embody within the patent warranted hereon all changes and modifications as reasonably and properly come within the scope of their contribution to the art.

We claim:

1. A low noise amplifier for a wireless communication system, comprising:
   an arrangement of active elements forming an amplifier having a signal input and a bias input and a signal output;
   an interconnection node between two of said active elements;
   an inductive element connected at one end to said interconnection node;
   a capacitance element connecting another end of said inductive element to ground, said inductive element and said capacitance element being selected to provide a notch filter for substantially reducing an amplitude of a predetermined frequency from a signal at said signal output; and
   a further active element connected to an interconnection node between said inductive element and said capacitance element, said further active element connected between said active elements and a supply voltage and having a connection to a control signal at an control input.

2. A low noise amplifier as claimed in claim 1, further comprising:
   a control element connected to said control input of said further active element.

3. A low noise amplifier as claimed in claim 2, wherein said control element is a controllable voltage source.

4. A low noise amplifier as claimed in claim 1, wherein said active elements are first and second field effect transistors connected to one another with a source and drain path of said first field effect transistor connected to a source and drain path of said second field effect transistor.

5. A low noise amplifier as claimed in claim 4, further comprising:
   inductor elements connected in series with said source and drain paths of said first and second transistors, said inductor elements and said first and second transistors being connected between a voltage supply and ground.

6. A low noise amplifier as claimed in claim 1, wherein said low noise amplifier is configured to operate at approximately 915 MHz.

7. A low noise amplifier as claimed in claim 1, wherein said predetermined frequency is an image frequency.

8. A low noise amplifier as claimed in claim 1, wherein said inductive element is a spiral inductor and said capacitive element is a metal-insulator-metal capacitor.

9. A low noise amplifier as claimed in claim 8, wherein said active elements are integrated on a semiconductor chip and said spiral inductor and said metal-insulator-metal capacitor are integrated on said same chip.

10. A low noise amplifier as claimed in claim 9, further comprising:
a further active element connected to an interconnection node between said inductive element and said capacitance element, said further active element connected between said active elements and a supply voltage and having a connection to a control signal at an control input, said further active element being integrated on said same semiconductor chip with said active elements.

11. A low noise amplifier as claimed in claim 1, wherein said active elements are integrated on a semiconductor chip and said inductive element and said capacitance element are integrated on said same chip.

12. A low noise amplifier as claimed in claim 11, further comprising:
further inductive elements connected to said active elements, said further inductive elements being enclosed within a housing of said semiconductor chip.

13. A low noise amplifier as claimed in claim 1, wherein said low noise amplifier is configured to operate at radio frequencies according to at least one of the standards selected from Zigbee, Wi-Fi and Bluetooth.

14. A low noise amplifier as claimed in claim 1, wherein said active elements include a common source transistor and common gate transistor, said common source transistor having a parasitic capacitance, said inductive element being of an inductance value to substantially cancel said parasitic capacitance.

15. A low noise amplifier as claimed in claim 1, wherein said active elements include a first transistor having a control lead connected to receive said input signal, said active elements include a second transistor having a control lead connected to receive said bias input.

16. A low noise amplifier for use in a-wireless communications system, comprising:
a first transistor having a control input connected to receive an input signal and having second and third leads;
a second transistor having a control input connected to receive a bias voltage and having second and third leads, said third lead of second transistor being connected to said second lead of said first transistor at an interconnection node;
a first inductor connected between said control input of said fast transistor and a signal input for said low noise amplifier;
a second inductor connected between said third lead of said first transistor and ground;
a third inductor connected between said second lead of said second transistor and a supply voltage;
a first capacitive element connected between said second lead of said second transistor and an output of said low noise amplifier;
a fourth inductor connected to said interconnection node between said first and second transistors, said fourth inductor having an opposite end at a second interconnection node;
a second capacitive element connected between said second interconnection node and ground; and
a third active element having a second lead connected between said second lead of said second transistor and having a third lead connected to said second interconnection node, said third active element having a control input.

17. A low noise amplifier as claimed in claim 16, further comprising:
a control voltage connected between to said control input of said third active element.

18. A low noise amplifier as claimed in claim 16, wherein said first and second and third active elements and said fourth inductor and said second capacitive element are integrated on a semiconductor chip.

19. A low noise amplifier as claimed in claim 18, wherein said semiconductor chip is constructed in CMOS technology.

20. A low noise amplifier as claimed in claim 16, further comprising:
a third capacitive element connected between said control input of said first active element and said third lead of said first active element.

21. A low noise amplifier as claimed in claim 16, wherein said low noise amplifier is configured to operate in a frequency range of 400 Mhz to 5900 MHz.

22. A low noise amplifier as claimed in claim 21, wherein said low noise amplifier is configured to operate at a frequency of about 915 MHz.

23. A low noise amplifier for use in a wireless communications system receiver, comprising:
a first transistor having a control input connected to receive an input signal and having second and third leads;
a second transistor having a control input connected to receive a bias voltage and having second and third leads, said third lead of second transistor being connected to said second lead of said first transistor at an interconnection node;
a first inductor connected between said control input of said first transistor and a signal input for said low noise amplifier;
a second inductor connected between said third lead of said first transistor and ground;
a third inductor connected between said second lead of said second transistor and a supply voltage;
a first capacitive element connected between said second lead of said second transistor and an output of said low noise amplifier;
a fourth inductor connected to said interconnection node between said first and second transistors, said fourth inductor having an opposite end at a second interconnection node;
a second capacitive element connected between said second interconnection node and ground; and
a third active element having a second lead connected between said second lead of said second transistor and having a third lead connected to said second interconnection node, said third active element having a control input.

24. A low noise amplifier for use in a wireless communications system receiver as claimed in claim 23, further comprising:
a control voltage connected between to said control input of said third active element.

25. A low noise amplifier for use in a wireless communications system receiver as claimed in claim 23, wherein said first and second and third active elements and said fourth inductor and said second capacitive element are integrated on a semiconductor chip.

26. A low noise amplifier for use in a wireless communications system receiver as claimed in claim 25, wherein said semiconductor chip is constructed in CMOS technology.

27. A low noise amplifier for use in a wireless communications system receiver as claimed in claim 23, further comprising:
a third capacitive element connected between said control input of said first active element and said third lead of said first active element.

28. A low noise amplifier for use in a wireless communications system receiver as claimed in claim 23, wherein said low noise amplifier is configured to operate in a frequency range of 400 MHz to 5900 MHz.

29. A low noise amplifier for use in a wireless communications system receiver as claimed in claim 28, wherein said low noise amplifier is configured to operate at a frequency of about 915 MHz.

30. A low noise amplifier for a wireless communication system, comprising:
an arrangement of active elements forming an amplifier having a signal input and a bias input and a signal output;

an interconnection node between two of said active elements;

an inductive element connected at one end to said interconnection node;

a capacitance element connecting another end of said inductive element to ground, said inductive element and said capacitance element being selected to provide a notch filter for substantially reducing an amplitude of a predetermined frequency from a signal at said signal output; said inductive element being a spiral inductor and said capacitive element being a metal-insulator-metal capacitor, wherein said active elements are integrated on a semiconductor chip and said spiral inductor and said metal-insulator-metal capacitor are integrated on said same chip; and a further active element connected to an interconnection node between said inductive element and said capacitance element, said further active element connected between said active elements and a supply voltage and having a connection to a control signal at an control input, said further active element being integrated on said same semiconductor chip with said active elements.

* * * * *